(12) United States Patent
Frolov et al.

(10) Patent No.: US 10,211,353 B2
(45) Date of Patent: Feb. 19, 2019

(54) ALIGNED BIFACIAL SOLAR MODULES

(75) Inventors: Sergey Frolov, Murray Hill, NJ (US);
Michael Cyrus, Summit, NJ (US);
Allan James Bruce, Scotch Plains, NJ (US)

(73) Assignee: SUNLIGHT PHOTONICS INC., Edison, NJ (US)

( * ) Notice: Subject to any disclaimer, the term of this patent is extended or adjusted under 35 U.S.C. 154(b) by 596 days.

(21) Appl. No.: 12/102,664

(22) Filed: Apr. 14, 2008

(65) Prior Publication Data

US 2009/0255567 A1    Oct. 15, 2009

(51) Int. Cl.
*H01L 31/043* (2014.01)
*H01L 31/042* (2014.01)
*H01L 31/054* (2014.01)

(52) U.S. Cl.
CPC .......... *H01L 31/043* (2014.12); *H01L 31/042* (2013.01); *H01L 31/0547* (2014.12); *Y02E 10/52* (2013.01)

(58) Field of Classification Search
CPC .......... H01L 31/0232; H01L 31/02327; H01L 31/043; H01L 31/0547; H01L 31/045; H01L 31/042; Y02E 10/50; Y02E 10/52
USPC ........................................ 136/262, 246, 245
See application file for complete search history.

(56) References Cited

U.S. PATENT DOCUMENTS

| | | | |
|---|---|---|---|
| 2,949,498 A | 8/1960 | Jackson | |
| 3,978,510 A | 8/1976 | Kasper et al. | |
| 4,094,704 A | 6/1978 | Milnes | |
| 4,335,266 A | 6/1982 | Mickelsen et al. | |
| 4,338,480 A | 7/1982 | Antypas et al. | |
| 4,477,721 A | 10/1984 | Chappell et al. | |
| 4,633,030 A | 12/1986 | Cook | |
| 4,686,323 A | 8/1987 | Biter et al. | |
| 4,690,355 A * | 9/1987 | Hornung | B64G 1/222 136/245 |
| 4,798,660 A | 1/1989 | Ermer et al. | |
| 4,984,439 A | 1/1991 | Smejda | |
| 5,131,955 A * | 7/1992 | Stern | B64G 1/443 136/245 |
| 5,223,043 A | 6/1993 | Olson et al. | |

(Continued)

FOREIGN PATENT DOCUMENTS

| | | |
|---|---|---|
| DE | 4141083 A1 | 6/1993 |
| GB | 2400725 | 10/2004 |

(Continued)

OTHER PUBLICATIONS

Suzuki, JP56165365 English translation, Dec. 18, 1981, JPO, 1-8.*

*Primary Examiner* — Allison Bourke
(74) *Attorney, Agent, or Firm* — Stuart H. Mayer; Mayer & Williams PC

(57) ABSTRACT

A photovoltaic device includes a plurality of photovoltaic cells disposed in an array in which each cell is adjacent to another cell. Each of the cells includes first and second photovoltaic modules. The first photovoltaic module of each cell is configured to convert a first part of light energy incident thereon into electrical energy and to reflect to the second photovoltaic module of an adjacent cell at least some of a remaining portion of light energy incident thereon. The second photovoltaic module of each cell is configured to convert into electrical energy the remaining portion of the light energy received from the first photovoltaic module of an adjacent cell.

11 Claims, 6 Drawing Sheets

(56) References Cited

U.S. PATENT DOCUMENTS

| | | | |
|---|---|---|---|
| 5,282,993 A | 2/1994 | Karg | |
| 5,441,897 A | 8/1995 | Noufi et al. | |
| 5,445,847 A | 8/1995 | Wada et al. | |
| 5,482,569 A | 1/1996 | Ihara et al. | |
| 5,567,469 A | 10/1996 | Wada et al. | |
| 5,626,688 A | 5/1997 | Probst et al. | |
| 5,902,417 A * | 5/1999 | Lillington | H01L 31/02167 136/246 |
| 5,985,691 A | 11/1999 | Basol | |
| 6,107,562 A | 8/2000 | Hashimoto et al. | |
| 6,258,620 B1 | 7/2001 | Morel et al. | |
| 6,259,016 B1 * | 7/2001 | Negami | H01L 31/02168 136/252 |
| 6,340,789 B1 | 1/2002 | Petritsch et al. | |
| 6,515,217 B1 * | 2/2003 | Aylaian | H01L 31/048 136/244 |
| 6,534,704 B2 | 3/2003 | Hashimoto et al. | |
| 6,559,372 B2 | 5/2003 | Stanbery | |
| 6,974,976 B2 | 12/2005 | Hollars | |
| 7,235,736 B1 * | 6/2007 | Buller et al. | 136/251 |
| 7,537,955 B2 | 5/2009 | Basol | |
| 2002/0043279 A1 | 4/2002 | Karg | |
| 2003/0213514 A1 * | 11/2003 | Ortabasi | H01L 31/052 136/246 |
| 2003/0234038 A1 | 12/2003 | Kurokami et al. | |
| 2004/0045598 A1 | 3/2004 | Narayanan et al. | |
| 2005/0056312 A1 | 3/2005 | Young et al. | |
| 2005/0236032 A1 | 10/2005 | Aoki | |
| 2005/0266600 A1 | 12/2005 | Basol | |
| 2005/0271827 A1 | 12/2005 | Krunks et al. | |
| 2006/0194371 A1 | 8/2006 | Okazaki et al. | |
| 2006/0211272 A1 * | 9/2006 | Lee et al. | 438/789 |
| 2006/0270236 A1 | 11/2006 | Kusumoto et al. | |
| 2007/0173034 A1 | 7/2007 | Tsurume et al. | |
| 2008/0041436 A1 | 2/2008 | Lau et al. | |
| 2008/0057203 A1 | 3/2008 | Robinson et al. | |
| 2008/0057616 A1 | 3/2008 | Robinson et al. | |
| 2008/0121277 A1 | 5/2008 | Robinson et al. | |
| 2008/0121724 A1 | 5/2008 | Beer et al. | |
| 2008/0124831 A1 | 5/2008 | Robinson et al. | |
| 2008/0175982 A1 | 7/2008 | Robinson et al. | |
| 2008/0257399 A1 * | 10/2008 | Wong et al. | 136/246 |
| 2008/0280030 A1 | 11/2008 | Van Duren et al. | |
| 2009/0107550 A1 | 4/2009 | Van Durgen et al. | |
| 2009/0162969 A1 | 6/2009 | Basol | |
| 2009/0229666 A1 | 9/2009 | Corneille et al. | |
| 2009/0250105 A1 | 10/2009 | Lee | |
| 2010/0029036 A1 | 2/2010 | Robinson et al. | |
| 2010/0129957 A1 | 5/2010 | Frolov et al. | |
| 2010/0140101 A1 | 6/2010 | Aksu et al. | |
| 2010/0180935 A1 | 7/2010 | Chen | |
| 2010/0184249 A1 | 7/2010 | Chen | |
| 2011/0039366 A1 | 2/2011 | Basol et al. | |

FOREIGN PATENT DOCUMENTS

| | | | |
|---|---|---|---|
| JP | 56165365 A * | 12/1981 | 136/243 |
| JP | 57153478 | 9/1982 | |
| JP | 07-066442 | 3/1995 | |
| JP | 2001308354 A | 11/2001 | |
| JP | 2004103834 A | 4/2004 | |
| JP | 2006024574 A | 1/2006 | |
| WO | 2010138635 | 12/2010 | |

* cited by examiner

ALIGNED BIFACIAL SOLAR MODULES

BACKGROUND

Field

The present invention relates to photovoltaic devices and methods of producing such devices. More particularly, the present invention relates to arrays of photovoltaic cells that have substantially improved optical spectral responsivity and efficiency, and that can be produced by joining and arraying multiples of discrete photovoltaic devices.

Related Art

Photovoltaic devices represent one of the major sources of environmentally clean and renewable energy. They are frequently used to convert optical energy into electrical energy. Typically, a photovoltaic device is made of at least one semiconducting material with p-doped and n-doped regions, respectively. The conversion efficiency of solar power into electricity of this device is limited to a maximum of about 37%, since photon energy in excess of the semiconductor's bandgap is wasted as heat. A photovoltaic device with multiple semiconductor layers of different bandgaps is more efficient: an optimized two-bandgap photovoltaic device has the maximum solar conversion efficiency of 50%, whereas a three-bandgap photovoltaic device has the maximum solar conversion efficiency of 56%. Realized efficiencies are typically less than theoretical values in all cases.

Multi-layered or multi-junction devices are currently manufactured as monolithic wafers, where each semiconductor layer is crystal-grown on top of the previous one. As a result, the semiconductor layers are electrically connected in series and have to be current-matched in order to obtain maximum conversion efficiency. This current-matching procedure complicates the design and decreases the efficiency of the device. The latter becomes particularly evident when considering the effect of spectral filtering on the device efficiency. If a part of the solar spectrum is absorbed or scattered, e.g. by water vapors, the resulting disproportional decrease of photocurrent in one of junctions will limit the current through the whole device and thus decrease its conversion efficiency.

Furthermore, currently manufactured multi-junction photovoltaic devices are multi-layered in series on top of each other, so that all the overlying or top junction layers, including conducting layers and semiconductor layers, have to be at least semi-transparent. The degree of this transparency determines the overall efficiency of the multi-junction device; more transparent layers produce higher efficiency devices. However, achieving high optical transparency in an electrically conducting material is difficult, and it usually results in a compromise between achieving low electrical resistivity and high optical transparency.

SUMMARY

In accordance with the present invention, a photovoltaic device is provided. The photovoltaic device includes a plurality of photovoltaic cells disposed in an array in which each cell is adjacent to another cell. Each of the cells includes first and second photovoltaic modules. The first photovoltaic module of each cell is configured to convert a first part of light energy incident thereon into electrical energy and to reflect to the second photovoltaic module of an adjacent cell at least some of a remaining portion of light energy incident thereon. The second photovoltaic module of each cell is configured to convert into electrical energy the remaining portion of the light energy received from the first photovoltaic module of an adjacent cell.

In accordance with one aspect of the invention, the first and second photovoltaic modules in at least one of the cells may be monolithically integrated.

In accordance with another aspect of the invention, the first part and the remaining portion of the light energy may be spectrally different parts of the optical energy.

In accordance with another aspect of the invention, at least 50% of the remaining portion of the light energy may be specularly reflected to the second photovoltaic module of the adjacent cell.

In accordance with another aspect of the invention, at least 90% of the remaining portion of the light energy may be specularly reflected to the second photovoltaic module of the adjacent cell.

In accordance with another aspect of the invention, a plurality of third photovoltaic modules may be provided, each of which is configured to receive and convert to electrical energy a portion of any light energy reflected by a respective one of the second photovoltaic modules.

In accordance with another aspect of the invention, the first photovoltaic modules may have an absorber layer with a larger bandgap than an absorber layer in the second photovoltaic modules.

In accordance with another aspect of the invention, the third photovoltaic modules may have an absorber layer with a bandgap that is smaller than the bandgap of the absorber layers in the first and second photovoltaic modules.

In accordance with another aspect of the invention, a plurality of additional photovoltaic modules may be located downstream from the plurality of photovoltaic cells. Each of the additional modules is configured to receive and convert to electrical energy a portion of light energy reflected by a respective one of the photovoltaic cells located upstream.

In accordance with another aspect of the invention, a photovoltaic device is provided that includes a substrate and a first photovoltaic module having a first semiconductor absorber layer and a first reflecting conducting layer disposed on the first semiconductor absorber layer. The photovoltaic device also includes a second photovoltaic module having a second semiconductor absorber layer. The first and second modules are attached to the substrate. The first and second modules are configured to respectively convert first and second parts of optical energy into electrical energy. The first reflecting conducting layer is configured to reflect at least a portion of the second part of the optical energy.

In accordance with another aspect of the invention, the second photovoltaic module may include a second reflecting conducting layer disposed on the second absorber layer.

In accordance with another aspect of the invention, the first and second modules may be attached to opposing sides of the substrate.

In accordance with another aspect of the invention, the first and second reflecting conducting layers may be disposed between first and second absorber layers, respectively, and the substrate.

In accordance with another aspect of the invention, the first and second modules may have a nonplanar configuration.

In accordance with another aspect of the invention, the first modules may have a cylindrical or parabolic configuration in cross-section.

In accordance with another aspect of the invention, a method is provided for converting optical energy to electrical energy. The method begins by receiving a first amount of optical energy from an energy source and converting at least a portion of the first amount of optical energy to electrical energy. Another portion of the first amount of optical energy is reflected to a downstream photovoltaic cell. In addition, a second amount of optical energy reflected from an upstream photovoltaic cell is received. At least a portion of the second amount of optical energy is converted to electrical energy.

In accordance with another aspect of the invention, the first amount of optical energy may be located at wavelengths shorter than wavelengths at which the second amount of optical energy is located.

DETAILED DESCRIPTION

Overview

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

As summarized above and described in more detail below, the apparatus for multi-junction photovoltaic energy conversion device and the method for producing the same is provided. Embodiments of this apparatus and method may facilitate the ability to efficiently and economically convert electromagnetic energy in the form of light into electrical energy in the form of electrical current. Embodiments of this apparatus and method may also facilitate large volume production and widespread usage of photovoltaic devices.

Multi-junction devices in general are a more efficient means for conversion of solar energy into electricity. However, the development of these devices is currently hindered by the complexity of semiconductor manufacturing processes, such as epitaxial film growth and high material cost. On the other hand, there are alternative technologies, such as those based on thin-films, where processing is substantially less complex and expensive. Thus a new approach is needed for implementing multi-junction device design utilizing low cost photovoltaic technologies.

This invention provides such an approach and an apparatus that operates as and realizes the benefits of a multi-junction solar cell and also can be built using low cost manufacturing approaches. This apparatus is an array of bi-facial solar cells, which consist of at least two different solar modules and in which the absorber bandgap of the top module is chosen to be larger than the absorber bandgap of the bottom module. Furthermore, the cells are highly reflecting for the part of solar light absorbed by the absorber. The array of such cells is constructed in such a way that the light reflected from the top module is directed towards and absorbed by the bottom module of an adjacent cell.

Figure 1:
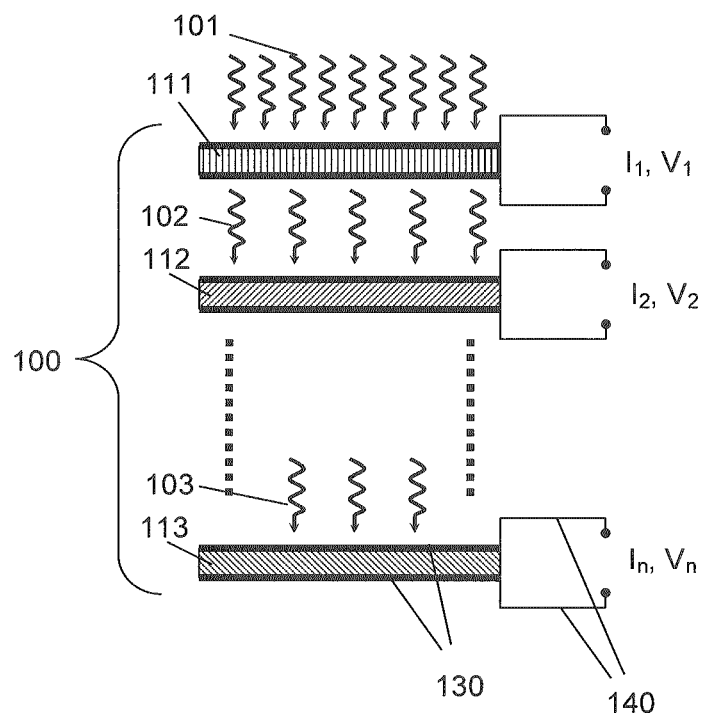
FIG. 1 shows the operation of a multi-layered, multi-junction photovoltaic device that includes three photovoltaic modules.
Figure 2:
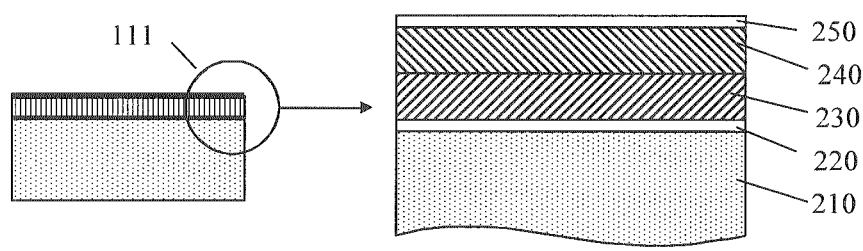
FIG. 2 shows a cross-section through one of the photovoltaic modules illustrated in FIG. 1.

As shown in FIGS. 1 and 2, a multi-junction photovoltaic device 100 may be produced from two or more photovoltaic modules such as the three photovoltaic modules 111, 112 and 113 shown in FIGS. 1 and 2. Each of the photovoltaic modules 111, 112 and 113 includes at least two conducting layers 220 and 250, and two semiconductor layers 230 and 240 that define a junction at their interface as shown in FIG. 2. Some of the junction layers may also include substrate 210. When photovoltaic device 100 is illuminated by light 101, one of its junction layers may absorb a part of light with photon energies above a corresponding bandgap and transmit a part of light (i.e. light 102 and 103) with photon energies below a corresponding bandgap. The junctions within and between modules may be arranged so that the bandgaps of lower lying junctions are smaller than the bandgaps of higher lying junctions; this condition improves the conversion efficiency of the device. Furthermore, these modules may be electrically connected with each other in series or alternatively isolated from each other and provided with two individual electrical contacts 130 of opposite polarity for producing electrical current connectors 140.

Figure 3:
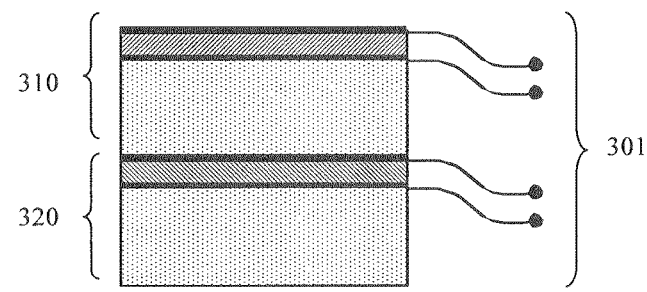
FIG. 3 shows a tandem solar cell composed of two integrated photovoltaic modules.

Current approaches to the design of multi-junction devices usually result in production of serially connected junctions. As a result, an electrical current through each junction must be the same; this is a condition called current matching and it is accomplished by careful selection of semiconductor bandgaps and layer thicknesses given a predetermined shape of the light spectrum. This current matching unduly complicates the design of the device, reduces its fault tolerance and may also reduce its conversion efficiency. For example, a failure of one junction will result in a failure of the whole device. Furthermore, under changing environmental conditions the spectrum of light used for energy conversion may change substantially. This effect may in turn lead to disproportionately different changes of current in different junctions, thus breaking the current matching condition and reducing conversion efficiency. For example, if an increase in the moisture content of the terrestrial atmosphere leads to a 50% reduction in the infrared portion of sunlight optical energy due to optical filtering effect, then a typical single crystal multi-junction device with Ge as a bottom layer active material may experience an overall 50% reduction in its output current. In this situation the bottom-most junction will limit the current provided by the whole device because the current in the upper junction or junctions cannot exceed this value even though they would be able to do so otherwise. As a result, the fill factor of the upper junction or junctions will be substantially reduced and the overall conversion efficiency of the device will decrease. As an example of a multi-junction solar cell, FIG. 3 shows a tandem solar cell 301 composed of two integrated photovoltaic modules 310 and 320, each having individual electrical contacts and thus avoiding the current matching condition of a regular tandem cell design.

Figure 4:
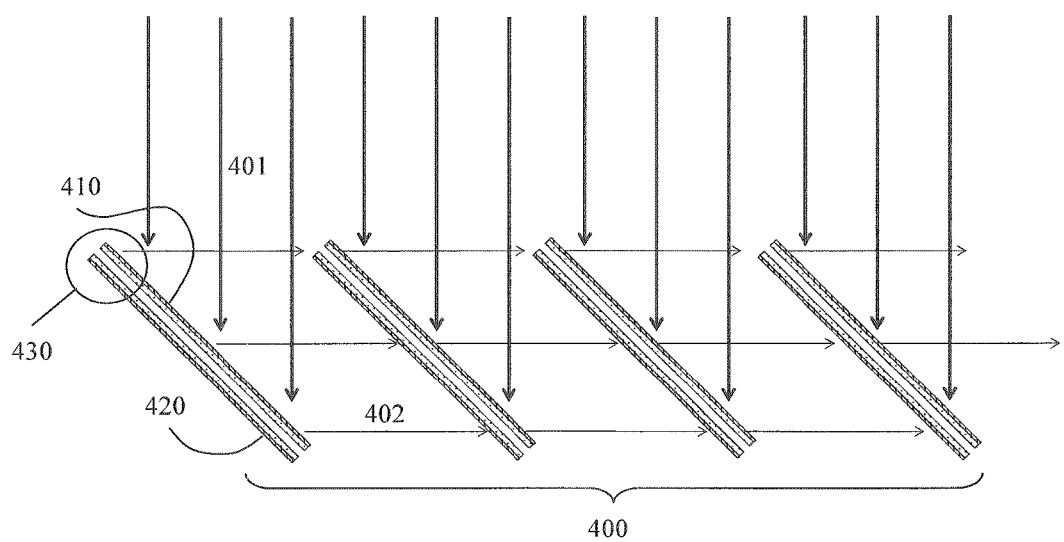
FIG. 4 shows one embodiment of an array of photovoltaic cells constructed in accordance with the present invention.

FIG. 4 shows an arrangement 400 that comprises an array or series of photovoltaic cells 430. The cells 430 are spatially separated from another and, in this example, are parallel to one another. Each cell 430 includes two (or possibly more) single-junction photovoltaic modules 410 and 420. Each module 410 and 420 may be of the type shown in FIG. 2, except that in the case of modules 410 and 420 the lower or bottom conducting layer 220 is reflective. In this way, a part 402 of incoming solar light 401 that is not absorbed by the modules 410 is then reflected by its bottom conductor so that it is redirected to the adjacent downstream cell 430, where it is absorbed by the module 420 of the downstream cell 430. Thus part of the energy carried by the light 401 is first converted into electricity by a multitude of modules 410 in each cell 430, and then the remaining energy in light 402 is converted into electricity by a multitude of modules 420 in the adjacent downstream cell 430. In this way each cell 430 (except for the first and last cells 430 in the array) converts light received from the energy source (e.g., the sun) as well as light reflected to it by an upstream adjacent cell 430.

In the array shown in FIG. 4, the module 410 and 420 do not have to be transparent and form a tandem in order to realize multi-junction photovoltaic energy conversion. Instead, the modules 410 and 420 in each cell 430 are optically opaque and reflecting. Furthermore, the modules 410 and 420 preferably include semiconductor absorber materials having different energy bandgaps. Furthermore, it is also preferred that the absorber in modules 410 have a larger bandgap than the absorber in the modules 420.

Solar arrays of the type shown in FIG. 4 may be used in large area solar plants in terrestrial applications as well as on board space vehicles and orbital stations. This approach may be particularly attractive for the latter application, because the cells can be manufactured on lightweight plastic substrates using thin film technology and thus achieve a very high specific power, i.e., produced electrical power per unit weight. Sun or other light source tracking mechanisms may be needed to achieve optimum performance.

Figure 5:
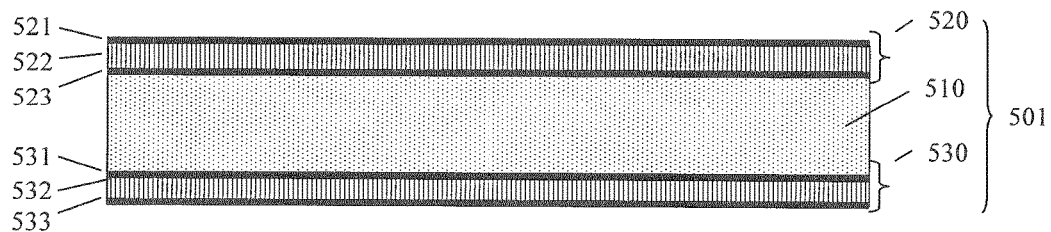
FIG. 5 shows a cross-section through one embodiment of an individual monolithically integrated photovoltaic cell.

FIG. 5 shows one embodiment of the invention, in which the modules 410 and 420 in each cell 430 of FIG. 3 are monolithically integrated to form a bifacial solar cell 501. As shown, the bifacial solar cell 501 includes a substrate 510 and two photovoltaic modules 520 and 530. The top module 520 contains at least one semiconductor absorber material 522 having a higher energy bandgap than that of at least one semiconductor absorber material 532 of the bottom module 530. In this way the top module 520 will absorb shorter wavelength light than the light absorbed by the bottom module 530. The top module 520 also includes conducting layers 521 and 523. The conducting layer 521 is transparent whereas the conducting layer 523 is reflecting (or contains a reflecting sublayer). Likewise, module 530 also contains conducting layers 531 and 533. The conducting layer 533 is transparent whereas the conducting layer 531 is reflecting (or contains a reflecting sublayer)

Figure 6:
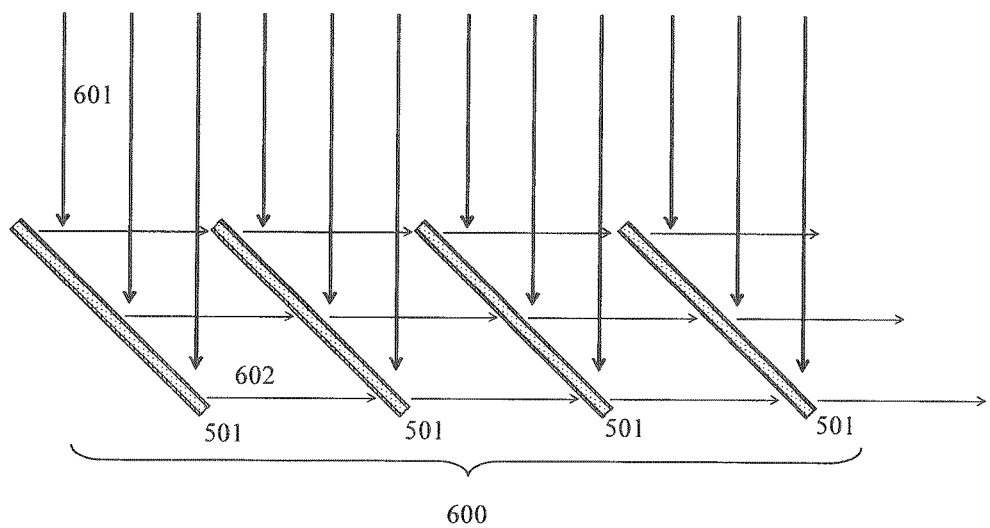
FIG. 6 shows another embodiment of an array of photovoltaic cells which employs the photovoltaic cells of the type depicted in FIG. 5.

FIG. 6 further shows another embodiment of this invention, in which an arrangement or array 600 of bifacial cells 501 is provided. This arrangement 600 operates in a manner similar to arrangement 400 depicted in FIG. 4 except that bifacial cells 501 are employed instead of the cells 430, which are formed form individual modules 410 and 420. The cells 501 are angled and positioned with respect to each other and the solar light beam 601 such that a portion of light 602 that is not absorbed in the top module of one cell 501 is reflected and absorbed in the bottom module of an adjacent cell 501. Such an array functions similarly to an array of two-junction tandem cells 301, thus achieving all the advantages of a multi-junction photovoltaic device. However, the arrangement 600 provides additional benefits because it is much simpler to manufacture a bifacial cell 501 in comparison to the tandem cell 301. Since no additional requirements are imposed on modules 520 and 530 in a bifacial cell 501, each module can be optimized and manufactured to achieve their best possible performance. In contrast, a tandem cell 301 requires at least one of its constituent modules to be transparent (e.g. module 310), which typically complicates its manufacturing and reduces its efficiency. Furthermore, the thickness of absorber layers in each module may be significantly reduced, since the light is reflected in each module and thus passes through each absorber layer twice. This reduction in the amount of relatively expensive absorber material in the solar cell very effectively lowers the manufacturing cost of a multi-junction array 600 and more than compensates for the additional solar cell area that is required because of the tilted orientation of the cells 501 with respect to the incoming optical energy.

In some embodiments the apparatus described above and shown in FIG. 6 may be modified to further include a frame and a light tracking mechanism, which would allow repositioning the array 600 for its best angular orientation with respect to the light source, e.g. the sun.

In some embodiments the absorber materials in the bifacial cell 501 contain active polycrystalline semiconductor materials based, for example, on a CIGS (Copper Indium Gallium Selenide) material system or a related alloy, and the corresponding junctions are produced using single-junction designs known in the art. By varying the In and Ga relative concentrations the bandgaps in the absorber layers 522 and 532 may be adjusted to about 1.6 eV and about 1.1 eV, respectively. The thickness of each layer may be in the range of 0.5 to 10 microns, but preferably in the range of 1 to 2 microns.

In some embodiments the transparent conducting layers 521 and 533 may be formed from thin layers of ITO or ZnO with a thickness in the range of 0.1 to 5 microns. The reflecting conducting layers 523 and 531 may be formed from one or more metals that serve as broadband optical reflectors that specularly reflect light. In some cases the reflecting conducting layers will preferably reflect more than 50% of the incident light, and more preferably more than 90% of the incident light. Illustrative metals that may be used include Mo, W, Au, Al or Ta, as well as combinations thereof. In some embodiments the metals layers may have a thickness in the range of 0.01 to 1 microns. Furthermore, modules 520 and 530 may also contain additional buffer layers, such as, for example, a thin CdSe layer with a thickness in the range of 10 to 1000 nm.

In yet other embodiments the apparatus described above and shown in FIG. 5 may be modified so that the active semiconducting material used in producing one or more junction layers is a material other than a CIGS-based material. This material may be, for example, CdTe. In another version of this embodiment this material may be a semiconducting polymer material, such as for example poly-phenylene-vinylene and its derivatives. A variety of other known and previously mentioned semiconducting materials may be chosen without departing from the scope of the invention. These include amorphous and nanocrystalline silicon, alloys of silicon and germanium, and germanium, which can be deposited in thin film form. Several III-V compound semiconductor materials are suitable as well, such as for example GaAs, GaInP and others.

In some embodiments the apparatus described above and shown in FIG. 5 can be modified to ensure that all device layers are optically smooth and produce negligible light scattering and good specular reflection.

In yet other embodiment the apparatus described above and shown in FIG. 5 can be modified to include thin gold conducting layers, which simultaneously provide excellent electrical conduction and high optical reflectivity across a wide spectral range. Similarly, a thin silver metal layer can be used for the same purpose.

Figure 7:
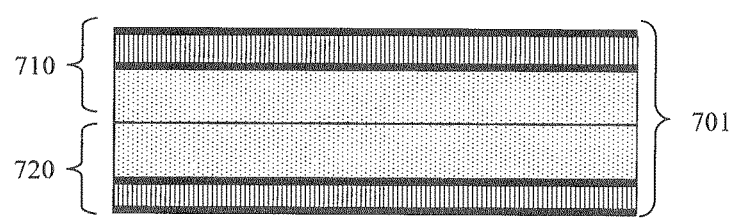
FIG. 7 shows a cross-section through an embodiment of an individual photovoltaic cell that is formed by attaching together two pre-formed photovoltaic modules.

In some embodiments a method is provided for producing a bifacial multi-junction photovoltaic cell 701 as shown in FIG. 7, for example, by attaching two single-junction photovoltaic modules 710 and 720 together. The modules 710 and 720 may each have their own individual substrates, which can attached to one another so that the two substrates are in direct contact with one another. The attachment could be produced by various known methods, including but not limited to gluing, lamination, bonding, welding and soldering.

Figure 8:
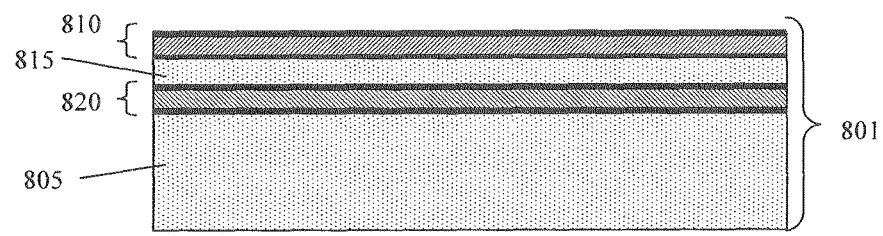
FIG. 8 shows a cross-section through another embodiment of an individual monolithically integrated photovoltaic cell.

In yet other embodiments a method is provided for producing a bifacial multi-junction photovoltaic cell 801 as shown in FIG. 8, for example by co-depositing two single-junction photovoltaic modules 810 and 820 together on the same transparent carrier substrate 805. The modules 810 and 820 may be electrically connected in series or alternatively, may be electrically insulated from each other by, for example, insulating layer 815. The layer 815 may also be optically opaque.

Figure 9:
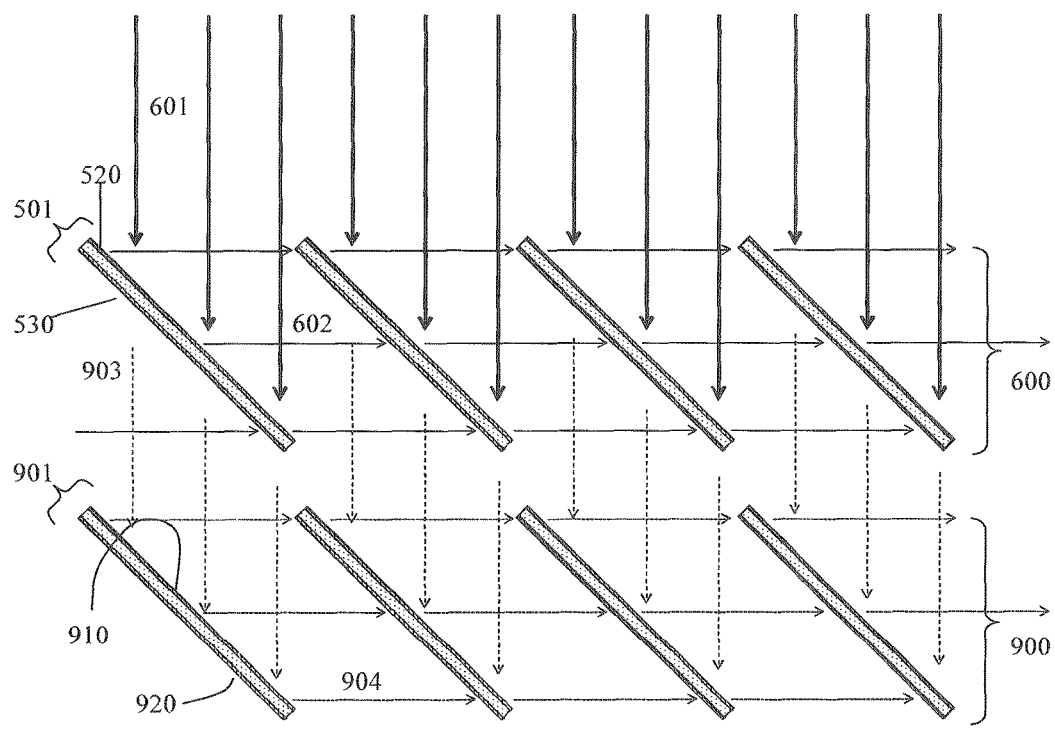
FIG. 9 shows another embodiment of an array of photovoltaic cells constructed in accordance with the present invention.

In yet other embodiments, such as shown in FIG. 9, the apparatus described above and shown in FIG. 6 can be modified to further include an additional array 900 of bifacial cells 901, each consisting primarily of a top module 910 and a bottom module 920. In this case, a part of the light 903 reflected from the module 530 of the cells 501 may be absorbed by the modules 910, and the remaining reflected part of light 904 may then be absorbed by the modules 920. The absorber bandgap of the module 910 is preferably smaller than those of modules 520 and 530. Also, the absorber bandgap of the module 920 is preferably smaller than that of the module 910. The functionality of such an apparatus is analogous to the functionality of a four-junction photovoltaic device.

In yet other embodiments the apparatus described above and shown in FIGS. 6 and 9 can be generalized to further include any number N of similarly positioned additional arrays of bifacial cells, each one of them intercepting, absorbing and converting into electrical energy parts of light that are unabsorbed and reflected by the preceding arrays. The functionality of such an apparatus is analogous to the functionality of a multi-junction photovoltaic device with 2N junctions.

Figure 10:
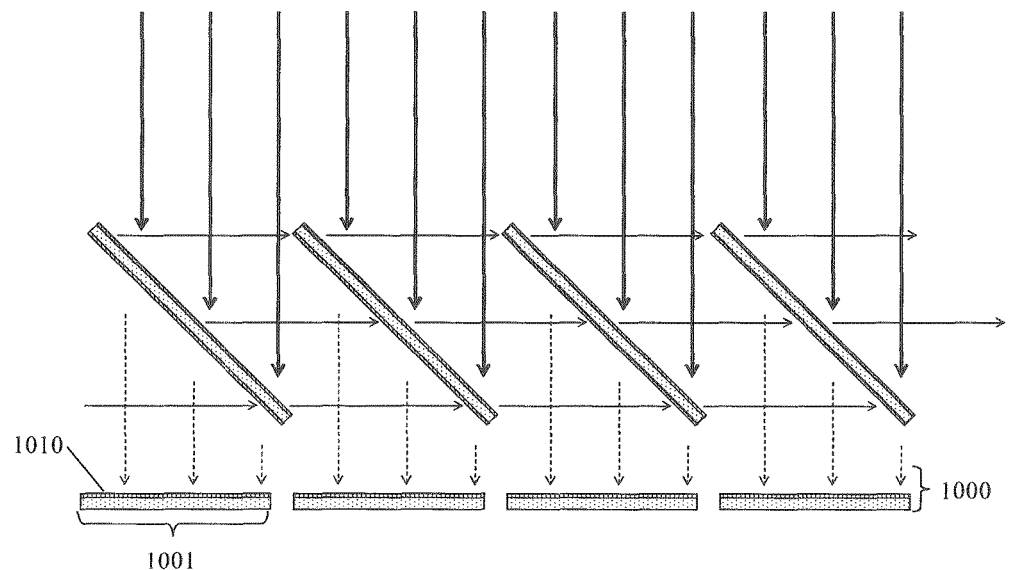
FIG. 10 shows yet another embodiment of an array of photovoltaic cells constructed in accordance with the present invention which employs additional photovoltaic modules.

In yet other embodiments the apparatus described above and shown in FIG. 6 can be modified to further include an additional array 1000 of cells 1001, consisting primarily of a top module 1010 as shown in FIG. 10. The absorber bandgap of the module 1010 is preferably smaller than those of modules 520 and 530 in cells 501. Light reflected by the cells 501 can be absorbed by module 1010.

In yet other embodiments the apparatus described above and shown in FIG. 6 can be modified to include an array 1100 of curved bifacial cells 1110 as shown in FIG. 10, each consisting of a top module 1120 and a bottom module 1130. This arrangement may provide a better light collection efficiency and higher angular tolerance to the array orientation with respect to the light beam 1101. The light 1102 reflected off the module 1120 may be focused on to the adjacent module 1130, so that the beam spot produced by light 1102 may substantially overlap the module 1130 area for various angles between the array 1100 and the light beam 1101. The shape of the curvature produced by the cells 1110 may be represented by a two-dimensional parabolic shape, such as a trough.

Figure 11:
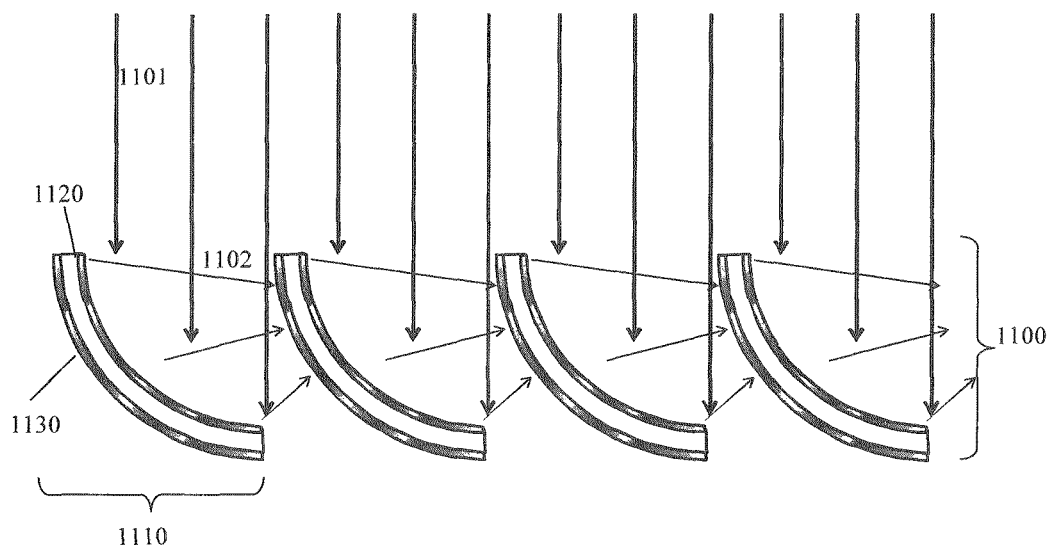
FIGS. 11 and 12 show, in a cross-sectional view and a perspective view, respectively, embodiments of an array of photovoltaic cells that are curved or non-planar in cross-section.
Figure 12:
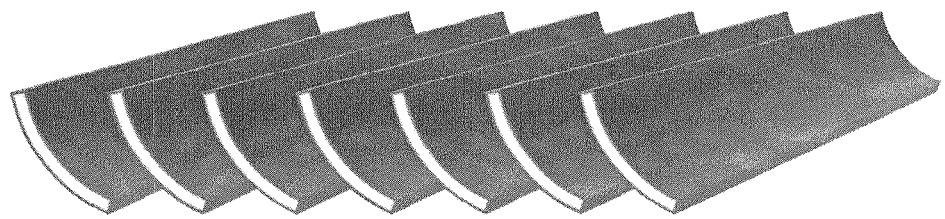

In yet other embodiments the apparatus described above and shown in FIG. 11 may be modified so that the shapes of the cells 1110 are cylindrical in at least one dimension as shown in FIG. 12.

Figure 13:
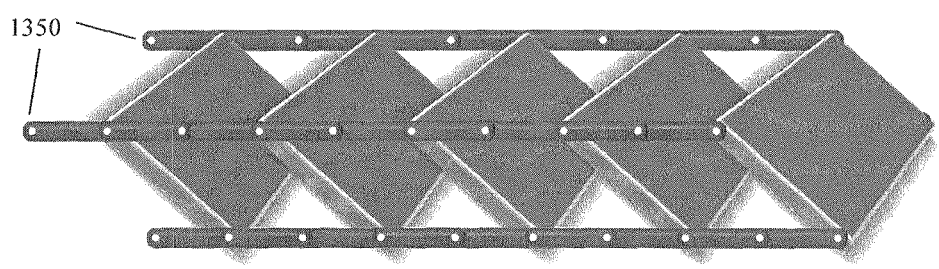
FIG. 13 shows a perspective view of an array of photovoltaic cells that is secured to a foldable frame.

In yet other embodiments the apparatus described above and shown in FIG. 6 may be modified to further include a foldable frame 1350, as shown in FIG. 13. The frame 1350 may allow folding an array (e.g. for storage and transportation), repositioning of bifacial cells with respect to each other (e.g. to improve light collection efficiency), moving an array of cells as a whole for better orientation with respect to the light source, and other mechanical functions.

Figure 14:
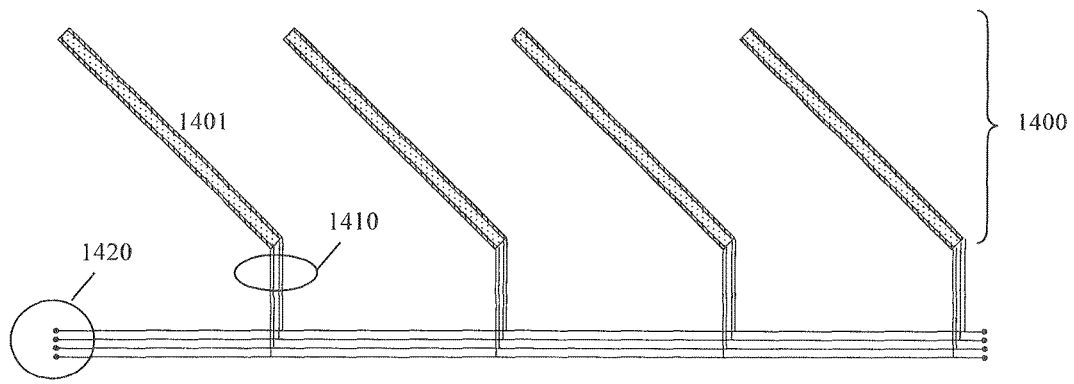
FIG. 14 shows the electrical outputs provided with one embodiment of an array of photovoltaic cells constructed in accordance with the present invention.

In yet other embodiments the apparatus described above and shown in FIG. 6 may be modified to further include four individual electrical outputs 1410 for each cell 1401 in the array 1400 shown in FIG. 14. The four electrical outputs 1410 represent two pairs of electrical connections for the two constituent modules of the bifacial cell 1401. The outputs 1410 may be further connected to at least one common bus, but preferably four different common busses 1420 as shown in FIG. 14.

In yet other embodiments the apparatus and method described above and shown in FIG. 14 may be modified so that two of electrical outputs may be shorted or connected to the ground without loss of device functionality.

In yet some other embodiments the apparatus and method described above and shown in FIG. 14 may be modified so that at least one electrical contact pair from a module is connected to an individual electrical grid, which improves conversion efficiency of the whole photovoltaic film.

In yet some other embodiments the apparatus and method described above and shown in FIG. 14 may be modified so that each electrical contact pair from the corresponding module is connected to an individual electrical grid, which improves conversion efficiency of the whole photovoltaic film.

In yet other embodiments the apparatus and method described above and shown in FIG. 14 may be modified so that each electrical contact pair from corresponding junction layers is connected to a DC-to-DC voltage converter.

In yet other embodiments the apparatus and method described above and shown in FIG. 14 may be modified so that each electrical contact pair from corresponding junction layers is connected to a DC-to-AC voltage converter.

In yet some other embodiment the apparatus and method described above and shown in FIG. 14 may be modified so that each electrical contact pair from corresponding junction layers is connected to a voltage converter. Each voltage converter may convert a different junction voltage to a common voltage. In this way all the junction layers may be connected in parallel without loss of functionality, thus providing only two output terminals.

In yet other embodiment the apparatus and method described above and shown in FIG. 14 may be modified so that at least one of the modules is subdivided into different sections and electrically connected in series to provide a higher output voltage.

In yet some other embodiments the apparatus and method described above and shown in FIG. 14 may be modified so that each of the two modules is subdivided into different sections and electrically connected in series to provide a higher output voltage. Furthermore, in some other embodiments the number of sections in each module may be chosen so as to provide substantially the same output voltage. As a result of such voltage matching, the electrical outputs of the two modules may be connected in parallel, thus providing two output electrical terminals and simplifying electrical interconnections without limiting the device performance.

In yet other embodiments the apparatus and method described above and shown in FIG. 14 may be modified so that each or some of the two modules include one or several bypass diodes for the electrical protection of the modules or subdivided sections thereof against large currents either in forward or reverse bias.

In yet other embodiments the apparatus and method described above and shown in FIGS. 4-14 may be modified so that some of the modules include additional dielectric layers, which may selectively reflect various portions of the incident optical energy. For example, in some embodiments a highly reflecting high-pass optical filtering layer may be deposited on the top modules (e.g. modules 410 in FIG. 4), in order to provide better reflection of the light at low photon energies (e.g. light 402). Furthermore, in some other embodiments, this reflecting layer may reflect a part (preferably, a small part) of light with high energy photons, in order to provide effective light soaking for the bottom modules (e.g. modules 420). Alternatively, this layer may be optimized to provide very low optical reflection (preferably, less than 2%) in the spectral region of interest, e.g. the visible range.

Variations of the apparatus and method described above are possible without departing from the scope of the invention.

What is claimed is:

1. A photovoltaic device, comprising: a plurality of photovoltaic cells disposed in a first and second array in which each cell is adjacent to another cell in each array, each of the cells being a bifacial photovoltaic cell that includes first and second photovoltaic modules located on opposing surfaces of a common planar substrate;
    said first photovoltaic module of each cell being configured to convert a first part of light energy incident thereon into electrical energy and to reflect to the second photovoltaic module of an adjacent cell at least some of a remaining portion of light energy incident thereon;
    said second photovoltaic module of each cell being configured to convert into electrical energy the remaining portion of the light energy received from the first photovoltaic module of an adjacent cell, wherein the first part and the remaining portion of the light energy are spectrally different parts of the optical energy, wherein at least one of the first and second photovoltaic modules includes a semiconductor absorber layer and a reflecting conducting layer disposed on and in contact with the semiconductor absorber layer, the first photovoltaic modules having an absorber layer with a larger bandgap than an absorber layer in the second photovoltaic modules, wherein the first and second arrays are each linear and the second array is offset from the first array such that a portion of light reflected from the second photovoltaic modules of the photovoltaic cells in the first array are directly reflected to respective ones of the first photovoltaic modules of the photovoltaic cells in the second array.

2. The photovoltaic device of claim 1 wherein the first and second photovoltaic modules in at least one of the cells are monolithically integrated.

3. The photovoltaic device of claim 1 wherein at least 50% of the remaining portion of the light energy is specularly reflected to the second photovoltaic module of the adjacent cell.

4. The photovoltaic device of claim 1 wherein at least 90% of the remaining portion of the light energy is specularly reflected to the second photovoltaic module of the adjacent cell.

5. The photovoltaic device of claim 1 wherein all of the plurality of photovoltaic cells are identical to one another.

6. The photovoltaic device of claim 1 wherein all of the photovoltaic cells have surfaces parallel to one another.

7. The photovoltaic device of claim 1 wherein the reflecting conducting layer is located between the semiconductor absorber layer and the common planar substrate.

8. The photovoltaic device of claim 1 further comprising a foldable frame on which each of the plurality of photovoltaic cells are secured such that the photovoltaic cells are repositionable on the foldable frame for selectively orienting the photovoltaic cells with respect to a light source.

9. The photovoltaic device of claim 1 wherein each photovoltaic module in each respective one of the photovoltaic cells has a separate electrical output.

10. A photovoltaic device, comprising: a plurality of photovoltaic cells disposed in a first and second array in which each cell is adjacent to another cell in each array, each of the cells having a first absorbing surface and a second absorbing surface opposing the first absorbing surface, each of the cells being a bifacial photovoltaic cell that includes first and second photovoltaic modules located on opposing surfaces of a common planar substrate;
    said first photovoltaic module of each cell being configured to convert a first part of light energy incident on the first absorbing surface of the respective cell into electrical energy and to reflect to the second photovoltaic module of an adjacent cell at least some of a remaining portion of light energy incident thereon;
    said second photovoltaic module of each cell being configured to convert into electrical energy the remaining portion of the light energy received from the first photovoltaic module of an adjacent cell, said remaining portion of the light energy received from the first photovoltaic module of an adjacent cell being incident on the second absorbing surface of each respective cell, wherein the first part and the remaining portion of the light energy are spectrally different parts of the optical energy, wherein at least one of the first and second photovoltaic modules includes a semiconductor absorber layer and a reflecting conducting layer disposed on and in contact with the semiconductor absorber layer, the first photovoltaic modules having an absorber layer with a larger bandgap than an absorber layer in the second photovoltaic modules, wherein the first and second arrays are each linear and the second array is offset from the first array such that a portion of light reflected from the second photovoltaic modules of the photovoltaic cells in the first array are directly reflected to respective ones of the first photovoltaic modules of the photovoltaic cells in the second array.

11. The photovoltaic device of claim 10 wherein the reflecting conducting layer is located between the semiconductor absorber layer and the common planar substrate.

* * * * *